United States Patent
Erskine et al.

[11] Patent Number: 5,262,029
[45] Date of Patent: Nov. 16, 1993

[54] METHOD AND SYSTEM FOR CLAMPING SEMICONDUCTOR WAFERS

[75] Inventors: David Erskine, Mountain View; Randall S. Mundt, Pleasanton; Dariush Rafinejad, Los Altos Hills; Vernon W. H. Wong, Mountain View; Gerald Z. Yin, San Jose, all of Calif.

[73] Assignee: LAM Research, Fremont, Calif.

[21] Appl. No.: 440,478

[22] Filed: Nov. 21, 1989

Related U.S. Application Data

[63] Continuation of Ser. No. 197,535, May 23, 1988, abandoned.

[51] Int. Cl.$^5$ ............................................. C23F 1/02
[52] U.S. Cl. ......................... 204/298.15; 156/345; 204/298.35; 118/503
[58] Field of Search ............ 204/192.11, 192.12, 204/192.32, 298 WH, 298 SC, 298 MC, 298 C, 298 E, 298 EM, 298.15, 298.23, 298.25, 298.02, 298.31, 298.35; 156/345; 118/500, 503, 505, 719, 728

[56] References Cited

U.S. PATENT DOCUMENTS

| | | | |
|---|---|---|---|
| 4,268,374 | 5/1981 | Lepselter | 156/345 X |
| 4,282,924 | 8/1981 | Faretra | 165/80 |
| 4,340,462 | 7/1982 | Koch | 204/298 |
| 4,367,114 | 1/1983 | Steinberg et al. | 156/345 X |
| 4,397,724 | 8/1983 | Moran | 204/298 E X |
| 4,473,455 | 9/1984 | Dean et al. | 156/345 X |
| 4,508,161 | 4/1985 | Holden | 165/1 |
| 4,512,841 | 4/1985 | Cunningham, Jr. et al. | 204/298 E X |
| 4,522,697 | 11/1985 | Dimock et al. | 204/298 WH |
| 4,603,466 | 8/1986 | Morley | 29/569 |
| 4,657,617 | 4/1987 | Johnson et al. | 204/298 EM |
| 4,671,204 | 6/1987 | Ballou | 118/503 X |

Primary Examiner—Nam X. Nguyen
Attorney, Agent, or Firm—Burns, Doane, Swecker & Mathis

[57] ABSTRACT

A wafer clamping mechanism includes a clamp ring having a central opening corresponding to the geometry of a conventional semiconductor wafer. An overhang located about the opening engages the corresponding semiconductor wafer when in place on an electrode of a plasma reactor. The clamp ring is resiliently mounted on a housing which holds a second electrode. The clamp ring is automatically engaged against the wafer as the spacing between the two electrodes is adjusted to a desired gap width. A raised annular barrier on the lower electrode circumscribes the wafer and engages a mating surface on the clamp ring in order to enhance alignment of the clamp.

8 Claims, 3 Drawing Sheets

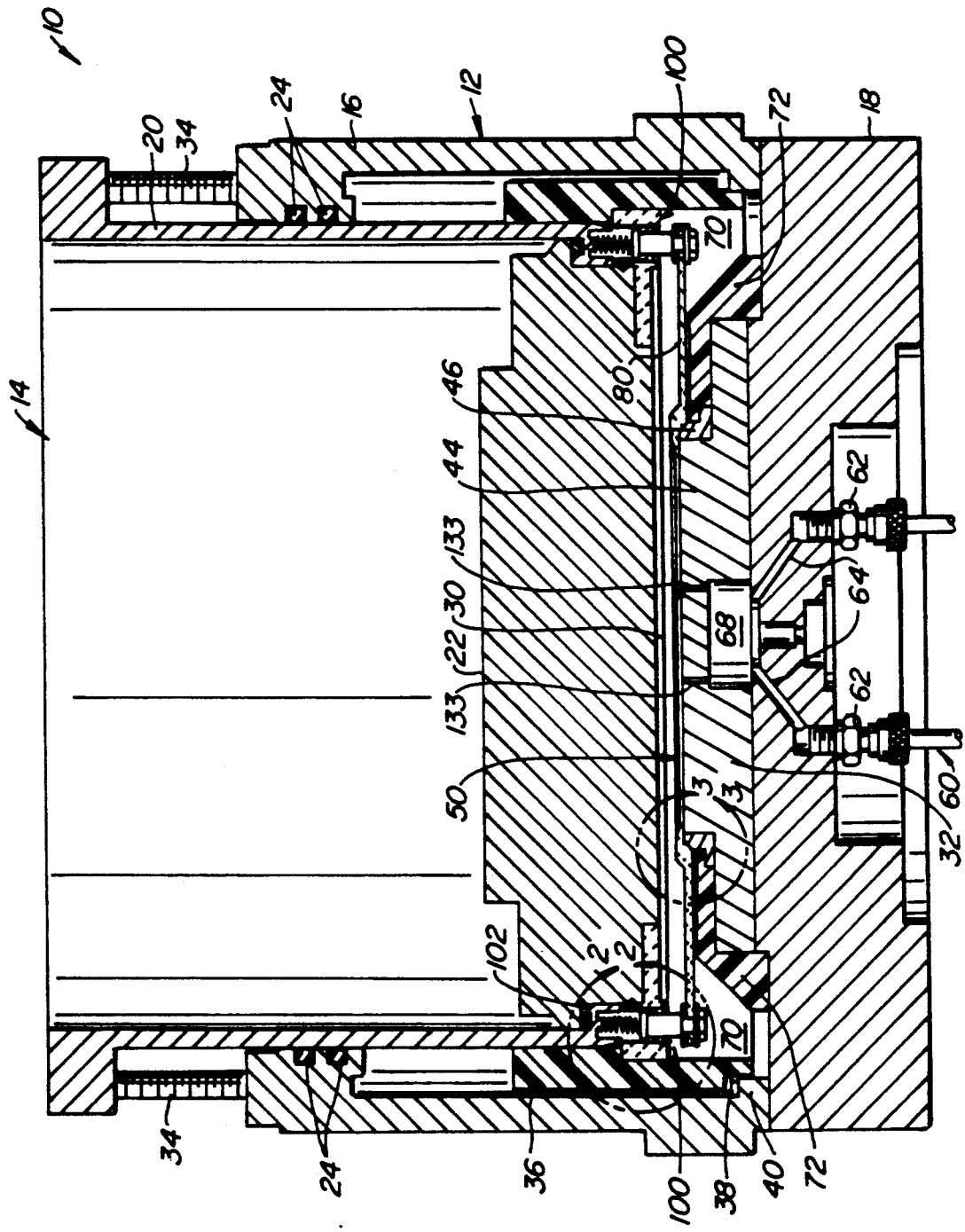
FIG._1.

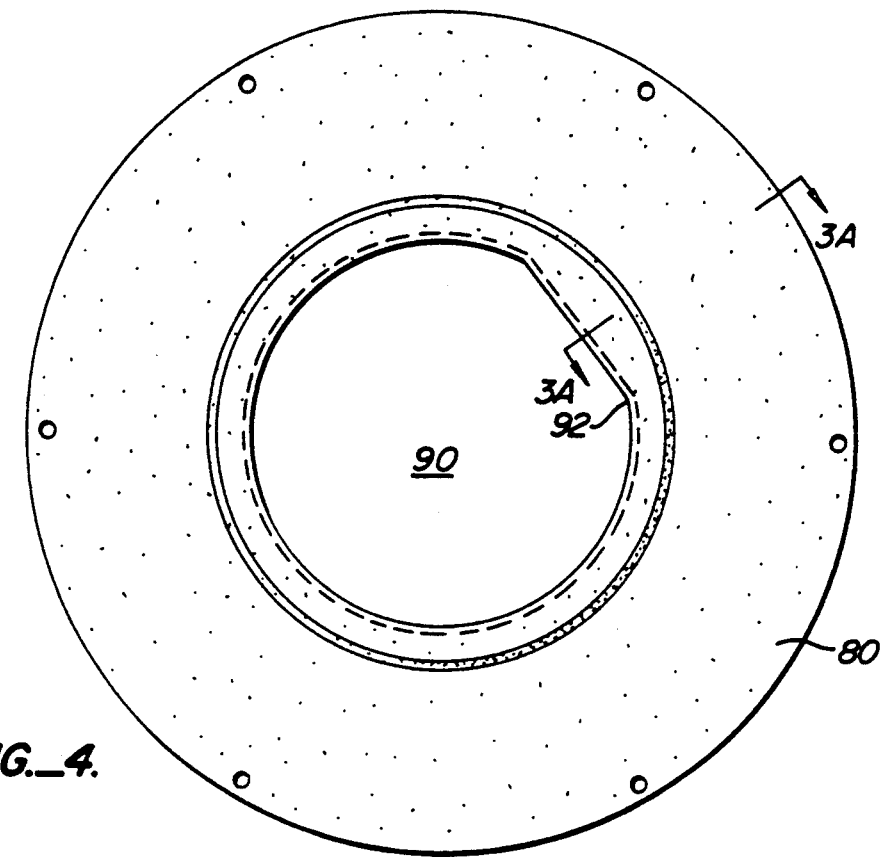
FIG._4.
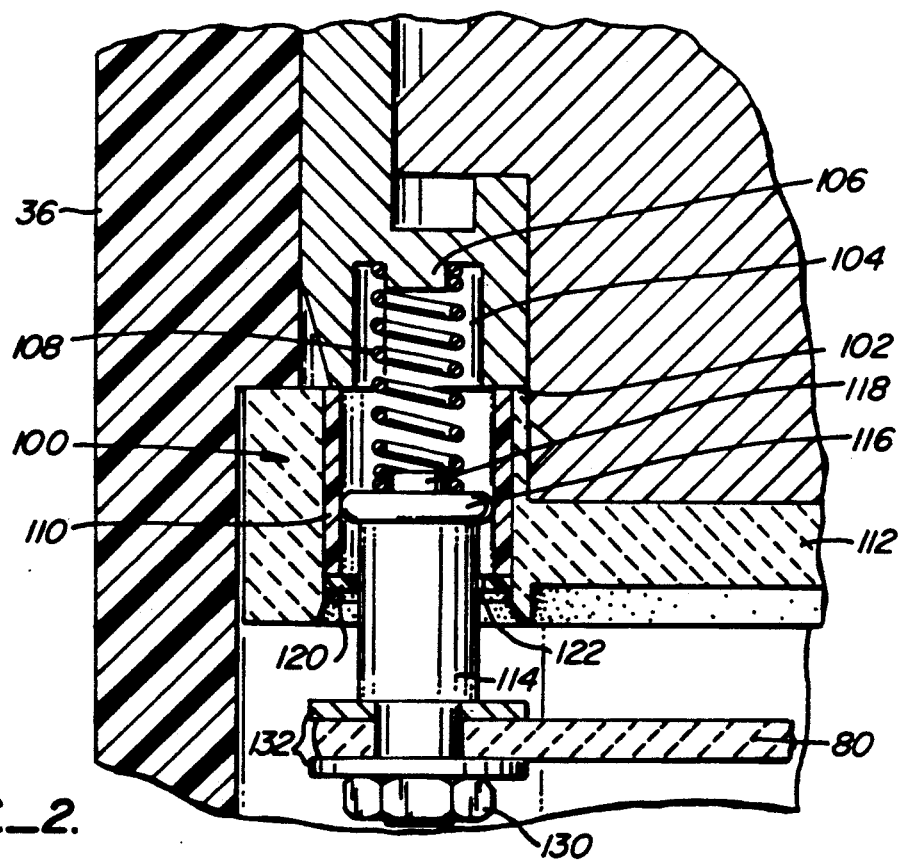
FIG._2.

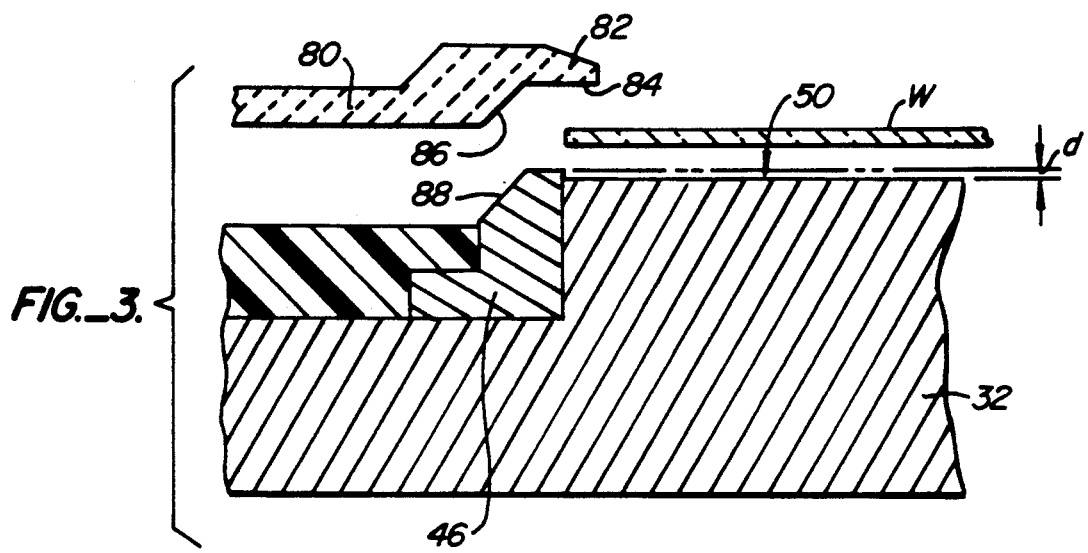
FIG._3.
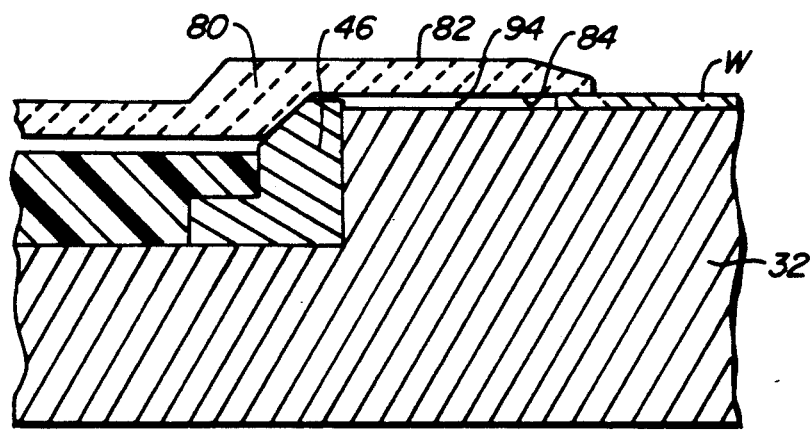
FIG._3A.

METHOD AND SYSTEM FOR CLAMPING SEMICONDUCTOR WAFERS

This is a continuation of application Ser. No. 07/197,535, filed May 23, 1988, now abandoned.

BACKGROUND OF THE INVENTION

1. Field of the Invention

The present invention relates generally to semiconductor processing equipment and methods. More particularly, the invention relates to a method and apparatus for retaining a semiconductor wafer on a surface during processing operations, such as plasma etching.

Semiconductor processing operations, such as plasma etching, ion implantation, chemical vapor deposition, and the like, frequently require that individual semiconductor wafers be retained on a flat or crowned surface, with a uniform and intimate contact being maintained between the wafer and the surface. For example, plasma etching requires that individual wafers be mounted on the exposed surface of an electrode located within a processing vessel. By positioning a second electrode proximate the exposed surface of the wafer and applying radio frequency energy to the electrodes, reactive plasma species are generated from introduced gases which will etch the surface according to well-known principles.

In order to achieve and maintain uniform etch characteristics, including directionality, selectivity, etch rate, and the like, it is necessary that the electrical and thermal environment proximate the semiconductor wafer be precisely controlled. In particular, it is necessary that the semiconductor wafer be tightly and uniformly held in place against the adjacent electrode surface in order to provide uniform cooling of the wafer and to minimize variations in the electric field produced by the pair of electrodes. Any variations in the thermal profile of the wafer or in the characteristics of the electric field will result in a non-uniform etch which can reduce both the quality and yield of the integrated circuits being produced.

In order to provide uniform contact between an individual semiconductor wafer and an adjacent surface, various clamping systems have been proposed for use in plasma etchers and other semiconductor processing equipment. Such previous clamping systems have, however, suffered from numerous drawbacks which result in less than uniform contact between the semiconductor wafer and the adjacent surface. For example, the clamping mechanisms seldom provide for precise positioning of the clamping element over the semiconductor wafer. The resulting misalignment of the wafer and the clamp frequently results in a varying contact pressure around the periphery of the wafer. The varying pressure, in turn, affects the rate of heat transfer from the wafer, resulting in undesired temperature gradients across the wafer. Thus, even very minor misalignment can substantially contribute to a non-uniform etch of the wafer. In addition to problems associated with misalignment, previous clamping mechanisms have frequently included components located too closely to the electrodes and thus have directly contributed to the generation of non-uniform electric fields. Moreover, the clamping mechanisms frequently cover a substantial portion of the peripheral region of the semiconductor wafer, thus reducing the yield of product from each wafer. For example, the clamping mechanisms have frequently been sized to extend radially inward a distance sufficient to cover the peripheral gaps created by the edge flats found on semiconductor wafers. Such additional overhang greatly increases the area of the wafer which is masked during the etching operation. In addition, prior art clamping systems have generally been unsuitable for use with variable gap plasma etchers, and have frequently resulted in the generation of relatively large quantities of particulates. Such particulates can adversely affect the fabrication process when they enter into the reaction chamber.

It would thus be desirable to provide for a wafer clamping mechanism which overcomes the problems just set forth.

2. Description of the Background Art

U.S. Pat. No. 4,340,462 describes a plasma reactor having parallel, spaced-apart electrodes where the electrodes are mounted on separate housings which are movable relative to each other to allow adjustment of the spacing between the electrodes. No clamping mechanism is provided for holding a wafer in place on the lower electrode. U.S. Pat. No. 4,282,924 discloses an ion implantation apparatus. A semiconductor wafer is held on a platen by a clamping ring mounted on the platen itself. U.S. Pat. No. 4,508,161 describes a method for holding a semiconductor wafer on a domed platen wherein the wafer is held about its periphery and a heat-conductive gas is introduced to the interstitial space between the wafer and the platen. U.S. Pat. No. 4,603,466 describes a domed platen for holding a semiconductor wafer where the wafer is held by a circular clamp.

SUMMARY OF THE INVENTION

According to the present invention, individual semiconductor wafers are retained against an adjacent surface, typically the electrode of a plasma etch reactor, by a ring clamp which is capable of being reciprocated relative to the surface. In a first aspect of the invention, a raised annular barrier is formed on the surface and defines a cavity for receiving the semiconductor wafer. The ring clamp includes a first surface capable of mating with the raised annular barrier and a second surface capable of retaining the semiconductor wafer within the receiving cavity. Contact between the first surface on the ring clamp and the raised annular barrier assures proper alignment of the ring clamp so that a desired, uniform pressure can be applied by the second surface of the ring clamp at all times. Usually, the ring clamp will be resiliently mounted on a reciprocating mechanism to allow sufficient freedom of movement to assure proper alignment. Also, the second surface of the ring clamp will be shaped to conform to the geometry of the particular semiconductor wafer being processed in order to minimize masking of the wafer during the processing operation.

In a second aspect of the present invention, the semiconductor reactor is a variable gap plasma reactor including a primary housing and a secondary housing. An electrode capable of supporting the semiconductor wafer being processed is mounted in the primary housing, and a second electrode is mounted in the secondary housing. The two housings may be precisely reciprocated relative to each other to provide a variable gap between the electrodes. The ring clamp is resiliently mounted on the secondary housing, providing for an automatic clamping of the semiconductor wafer as the second housing is moved toward the first housing to provide the desired electrode gap. Preferably, the two aspects of the present invention will be combined as in the specific embodiment described hereinbelow.

The method of the present invention relies on precise positioning of the semiconductor wafer undergoing processing on the support surface, usually the electrode surface of a plasma etch reactor. The wafer is positioned so that the edge flats are rotationally oriented in predefined locations. A ring clamp having a peripheral geometry which corresponds precisely to that of the semiconductor wafer is then lowered to clamp the wafer onto the support surface. In this way, excess overhang of the ring clamp resulting in undesired masking of the semiconductor wafer surface is avoided. Usually, the ring clamp will extend over the wafer by a distance no greater than about 0.15 cm in the radial direction at any location on the wafer periphery.

The method and apparatus of the present invention enjoys a number of advantages when compared with previous wafer clamping systems. In particular, the present invention provides a highly uniform clamping pressure about the periphery of the wafer, resulting in an even thermal contact with the underlying electrode surface and improved etch uniformity. The conformal design of the clamp plate also minimizes the masking of the wafer during processing (thus maximizing device yield) and helps prevent unwanted arcing between the wafer and the reactor vessel at high power levels. The design of the present invention is also compatible with variable gap plasma reactors and has been designed to display minimal impact on the flow of reactant gases within the reactor vessel. The present invention further provides for low particulate generation during use (by minimizing the contact area between moving parts and providing for containment of any particles which are produced), and minimizes the effects of any leakage of backside cooling gases because of the broad width of the ring clamp. The ring clamp is self-aligning with respect to the wafer, reducing the close mechanical tolerances required in most previous systems and contributing to the reduction and wafer masking by the ring clamp.

BRIEF DESCRIPTION OF THE DRAWINGS

FIG. 1 is a cross-sectional view of a variable gap plasma reactor employing a clamping mechanism constructed in accordance with the principles of the present invention.

FIG. 2 is a detail view taken from section 2—2 in FIG. 1.

FIG. 3 is a detail view taken from section 3—3 in FIG. 1.

FIG. 3A is a detail view similar to FIG. 3, taken along line 3A—3A in FIG. 4.

FIG. 4 is a top view of the ring clamp employed in the embodiment of FIG. 1.

DESCRIPTION OF THE SPECIFIC EMBODIMENTS

Referring now to FIG. 1, a plasma etch reactor 10 includes a primary housing 12 and a secondary housing 14. Primary housing 12 includes a cylindrical wall 16 and a base plate 18 extending across the lower open end of the cylindrical body 16. Similarly, the secondary housing 14 includes a cylindrical body 20 and an electrode assembly 22 extending across the open lower end of the cylindrical body 20.

Secondary housing 14 is reciprocatably mounted within the upper end of the cylindrical body 16 of the primary housing 12. O-ring seals 24 are provided to help maintain a vacuum in a reaction chamber 30 defined between the lower surface of the electrode assembly 22 and the upper surface of a first electrode 32 mounted on the base plate 18. A mechanism for reciprocating the secondary housing 14 relative to the primary housing 12 is schematically illustrated by adjustment screws 34. Particular mechanisms for adjusting the gap between the electrodes in the plasma reactor 10 of the present invention are described in the patent literature. See, for example, U.S. Pat. No. 4,340,462, the entire disclosure of which is incorporated herein by reference.

Usually, a shroud ring 36 formed from an inert, low-dielectric material, such as Teflon ®, will be provided around the lower end of the secondary housing 14. The lower end of the shroud ring 36 includes a taper or indentation 38 which provides clearance for a shoulder 40 formed on the interior surface of the cylindrical body 16 of the primary housing 12. The shroud ring is provided to help contain the plasma generated in reaction chamber 30 and to prevent arcing with cylindrical wall 16.

Referring now to FIGS. 1 and 3, the first electrode 32 includes a raised pedestal region 44 which will generally have a circular periphery slightly larger than the diameter of the semiconductor wafer to be treated, typically having a diameter in the range from about 0.15 to 1.0 mm greater than the wafer diameter. The upper surface of the raised pedestal region 44 may be flat (as illustrated) or crowned and is intended to receive a semiconductor wafer thereon. The use of crowned support surfaces for semiconductor wafers in plasma etching and other applications is known in the prior art, as described in U.S. Pat. Nos. 4,508,161 and 4,603,466, the entire disclosures of which are incorporated herein by reference. The electrode 44 will be composed of a thermally and electrically conductive material, typically being aluminum or an aluminum alloy.

The raised pedestal region 44 is circumscribed about its periphery by a raised annular barrier 46. The upper end of the raised annular barrier 46 will extend above the upper surface of the electrode 32 by a distance d which is less than the thickness of a semiconductor wafer w (FIG. 3) to be processed. Typically, the distance d will be in the range from about 0.15 to 0.6 mm, more typically being in the range from about 0.2 to 0.5 mm. Thus, the raised annular barrier 46 circumscribing the raised pedestal region 44 defines a generally circular cavity 50 having a diameter just slightly larger than the semiconductor wafer w to be processed and a depth slightly less than said semiconductor wafer.

Usually, a system 60 will be provided for supplying a coolant gas, such as hydrogen or helium, into the interstitial region created between the wafer and the first electrode 32 when the wafer is mounted thereon. Gas supply system 60 includes inlet and outlet connections 32 which are connected by port 64 to a plenum 68. In turn, the plenum supplies gas to the upper surface of the electrode 32. The gas vents from the periphery of the electrode 32 and is withdrawn through a plenum 70 which surrounds the electrode 32. As will be described in more detail hereinafter, the clamping mechanism of the present invention helps assure that gas which vents about the periphery of the wafer w will not adversely affect the process occurring in the reaction chamber 30.

The raised annular barrier 46 is circumscribed by an electrode focus ring 72 which acts to modify the electric field around the wafer. The material, shape, and construction of the focus ring can be changed to either focus or diffuse the plasma as required by the etching process.

Referring now to FIGS. 1, 3, and 4, a clamp ring 80 includes a peripheral overhang 82 having a lower surface 84 which will engage the peripheral edge of wafer w when the ring 80 is lowered (as illustrated in FIG. 1). The clamp ring 80 includes a second surface 86 which is inclined to form a conical section about the lower end of the primary aperture in the ring 80. The surface 86 will mate with a chamfered surface 88 located about the outer periphery of the raised annular barrier 46. Mating between the conical surface 86 and the chamfered surface 88 helps assure the proper alignment of the clamp ring 80 relative to the wafer-holding cavity 50 on electrodes 32.

The clamp ring 80 is a generally circular plate composed of a rigid material and having a central opening 90. The material may be an electrically conductive or non-conductive material, such as a coated aluminum, depending on the etching requirements. The central opening 90 can have any peripheral geometry, but will usually correspond to the shape of a conventional semiconductor wafer, including irregular peripheral geometries such as flat edge regions which identify the particular crystalline orientation of the wafer. As illustrated in FIG. 4, the central opening 90 includes a single flat edge 92. Semiconductor wafers may include one or two flat edges, which may be positioned at well-known rotational orientations along the periphery of the wafer. The periphery of central opening 90 will be slightly smaller than the peripheral dimensions of the corresponding semiconductor wafer, typically providing an overhanging surface 84 which will overly approximately the outermost 0.15 cm of the semiconductor wafer w.

The width of ring clamp 80 is sufficient to extend from the periphery of the wafer in cavity 50 to proximate the shroud ring 36. Thus, any coolant gas leaking from under the periphery of the wafer will generally be prevented from flowing upward into the evacuated reaction chamber 30. As such leakage into chamber 30 would be detrimental, the ring 80 design is particularly advantageous.

Referring now to FIG. 3A, the overhang 82 located adjacent the central opening 90 in the area of the flat region 92 will extend substantially further than the overhang 82 located about the circular periphery (as illustrated in FIG. 3). This is necessary, of course, so that the lower surface 84 of the overhang 82 will be able to extend to the flat edge of the wafer w to provide the desired uniform clamping about the entire edge region of the wafer. As the cavity 50 defined by the raised annular barrier 46 is circular, there will be a substantial gap 94 remaining the barrier 46 and the flat edge of the wafer w. The gap 92, however, is not found to adversely affect the processing characteristics of the plasma reactor 10.

Referring now to FIGS. 1 and 2, mounting of the ring clamp 80 on the lower end of the secondary housing 14 will be described. The ring clamp 80 is resiliently or compliantly mounted on the secondary housing 14 by a plurality (six in the specific embodiment) of spring assemblies 100. The spring assemblies 100 are mounted in a shoulder 102 formed about the lower end of the secondary housing 14. A counterbore 104 in the shoulder 102 includes a peg 106 (which may be a separate plastic retainer piece) which receives one end of a spring 108. A cylinder 110 formed from an lubricous material such as Kel-F ® or Teflon ® is mounted at the lower end of penetration 104 and held in place by a spring assembly retainer 112. A plunger 114 is reciprocatably mounted within the cylinder 110 and includes an annular ring 116 which slides against the interior surface of the cylinder 110. A peg 118 is formed on the upper end of the plunger 114 and receives the other end of the spring 108. In this way, the plunger 114 is spring-biased in the downward direction generally away from the secondary housing 14. A retaining ring 120 is positioned at the lower end of cylinder 110 and acts to align the plunger 114. The hole in clamp ring 80 which retains the plunger 114 is oversized, allowing the clamp ring to move horizontally relative to the plunger while still being held by washers 132. Thus, as a result of both the limited horizontal movement and the vertical movement allowed by the spring 108, the clamp ring 80 is able to precisely align with the raised annular barrier 46 on the first electrode 32, regardless of any misalignments which might be present elsewhere in the system. The clamp ring 80 is held in place at the lower end of the plungers 14 by a retaining nut 130 and the pair of washers 132.

In operation, individual semiconductor wafers w are fed into the reaction chamber 30 (between the first electrode 32 and the electrode assembly 22) by a wafer transport system (not illustrated). It is necessary that the position and rotational orientation of the wafer be precisely controlled so that the wafer is correctly received within the cavity 50 and the edge flat(s) are correctly positioned so that the clamp 80 will be able to properly clamp the wafer. A suitable system for transporting wafers to the reactor 10 in the proper position is described in detail in U.S. Pat. No. 4,833,790 and entitled "Method and System for Locating and Positioning Circular Workpieces", the entire disclosure of which is incorporated herein by reference.

Once the wafer is brought to the appropriate position by the transport system, a plurality of support pegs (not illustrated) in channels 133 will raise to lift the wafer from a transfer arm of the support system. The transfer arm will then be retracted and the support pegs lowered so that the semiconductor wafer w is correctly positioned in the cavity 50.

Thereafter, the upper housing 14 is lowered by the positioning screws 34 until the desired gap between the lower surface of electrode assembly 22 and upper surface of the wafer w is established. The clamp ring 80 is positioned on the spring assemblies 100 so that the primary surface 84 of the ring engages the wafer before the secondary assembly is fully lowered. Thus, the spring elements 108 will be compressed, applying an even force about the periphery of the clamp ring 80. The clamp ring will be properly aligned as a result of the interaction of the secondary surface 84 of the ring 80 and the chamfered surface 88 of the raised annular barrier 46, and the pressure applied about the periphery of the wafer w will be substantially uniform. Once the secondary housing 14 is lowered to the desired position, the plasma etch reaction can be commenced.

Although the foregoing invention has been described in some detail by way of illustration and example for purposes of clarity of understanding, it will be obvious that certain changes and modifications may be practiced within the scope of the appended claims.

What is claimed is:

1. A system for clamping a semiconductor wafer on a holder surface, said system comprising:
    a raised annular barrier on the surface defining a cavity for receiving the semiconductor wafer, said annular barrier including an outer peripheral rim;
    a ring clamp including a first surface capable of mating with the outer peripheral rim of the raised annular barrier and a second surface capable of retaining the wafer when said wafer is located within the cavity, whereby mating between the first surface of the ring clamp and the peripheral rim aligns the clamp with the cavity; and
    means for reciprocating the ring clamp relative to the holding surface, whereby the first surface engages the barrier to align the ring clamp and the second surface engages the wafer to hold said wafer in place.

2. A system as in claim 1, further including a raised pedestal region on the holding surface, wherein the raised annular barrier circumscribes the raised pedestal region.

3. A system as in claim 1, wherein the outer peripheral rim of the raised annular barrier includes a chamfered periphery and wherein the first surface on the ring clamp is similarly chamfered to mate and align with the rim as the ring clamp and holding surface are brought together.

4. A system as in claim 1, wherein the raised annular barrier defines a circular cavity and the second surface on the ring clamp is shaped to conform to a semiconductor wafer having an irregular peripheral geometry.

5. A system as in claim 1, wherein the means for reciprocating the ring clamp relative to the holding surface includes a housing, means for reciprocating the housing relative to the holding surface, and means for resiliently attaching the ring clamp to the housing.

6. A system as in claim 5, wherein the holding surface is an electrode and means for reciprocating the ring clamp relative to the holding surface includes a second electrode mounted on the housing.

7. A system as in claim 5, wherein the means for resiliently attaching the ring clamp to the housing includes a plurality of spring assemblies secured about the outer periphery of the ring clamp.

8. A system as in claim 7, wherein each spring assembly comprises a lubricous cylinder, a plunger element reciprocatably mounted in the cylinder, and a spring element extending between the housing and the plunger element.

* * * * *